(12) United States Patent
Miyamoto

(10) Patent No.: US 9,685,268 B1
(45) Date of Patent: Jun. 20, 2017

(54) WIRE WOUND-TYPE INDUCTOR

(71) Applicant: MURATA MANUFACTURING CO., LTD., Kyoto-fu (JP)

(72) Inventor: Masashi Miyamoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/371,575

(22) Filed: Dec. 7, 2016

(30) Foreign Application Priority Data

Dec. 11, 2015  (JP) ................. 2015-242143

(51) Int. Cl.
*H01F 27/32* (2006.01)
*H01F 17/03* (2006.01)
*H01F 27/28* (2006.01)
*H01F 27/29* (2006.01)
*H05K 1/18* (2006.01)
*H01F 27/02* (2006.01)
*H01F 5/06* (2006.01)

(52) U.S. Cl.
CPC .............. *H01F 27/32* (2013.01); *H01F 5/06* (2013.01); *H01F 17/03* (2013.01); *H01F 27/022* (2013.01); *H01F 27/2823* (2013.01); *H01F 27/292* (2013.01); *H01F 27/327* (2013.01); *H05K 1/181* (2013.01); *H05K 2201/1003* (2013.01)

(58) Field of Classification Search
CPC .......... H01F 5/06; H01F 27/32; H01F 27/327
See application file for complete search history.

(56) References Cited

FOREIGN PATENT DOCUMENTS

| JP | H04-137507 A | 5/1992 |
| JP | H10-172832 A | 6/1998 |
| JP | 2002-110428 A | 4/2002 |
| JP | 2004-006696 A | 1/2004 |
| JP | 2004-087556 A | 3/2004 |
| JP | 2006-196492 A | 7/2006 |
| JP | 2008-016462 A | 1/2008 |

*Primary Examiner* — Jeremy C Norris
(74) *Attorney, Agent, or Firm* — Studebaker & Brackett PC

(57) ABSTRACT

A wire wound-type inductor is a chip type and includes a core including a winding core part having a substantially taper-shaped portion and flange portions, a winding wire that is coated with an electrically insulating coating film, terminal electrodes to which respective end portions of the winding wire are connected, and a resistive conductor containing conductive powder. The core is made of ceramics and the resistive conductor is arranged so as to cover at least a part of the surrounding of an outer side portion of the winding wire.

7 Claims, 8 Drawing Sheets

WIRE WOUND-TYPE INDUCTOR

CROSS REFERENCE TO RELATED APPLICATIONS

This application claims benefit of priority to Japanese Patent Application 2015-242143 filed Dec. 11, 2015, the entire content of which is incorporated herein by reference.

TECHNICAL FIELD

The present disclosure relates to a wire wound-type inductor, in particular, relates to a wire wound-type inductor including a winding core part having a substantially taper-shaped portion the diameter of which is decreased from one end portion toward the other end portion.

BACKGROUND

For example, Japanese Unexamined Patent Application Publication No. 4-137507 or Japanese Unexamined Patent Application Publication No. 2004-6696 discloses a wire wound-type inductor including a winding core part having a substantially taper-shaped portion, which is interesting for the present disclosure.

The wire wound-type inductor as disclosed in Japanese Unexamined Patent Application Publication No. 4-137507 includes a substantially circular cone-shaped main shaft made of a dielectric material and a winding wire one end of which is fixed to the top of the substantially circular cone-shaped main shaft and which is wound around the circumference of the main shaft in an adjacent manner such that the diameter thereof is gradually decreased.

The wire wound-type inductor as disclosed in Japanese Unexamined Patent Application Publication No. 2004-6696 includes a core formed by flange portions having substantially rectangular parallelepiped shapes at both end portions of a substantially taper-shaped cylindrical winding wire part, a winding wire wound around the outer circumferential surface of the winding wire part of the core, and an outer body having a substantially rectangular parallelepiped shape, which covers the core and the winding wire. Two outer electrode terminals are formed at lower positions on both side surfaces of the outer body in an adhesion manner and these outer electrode terminals and terminal portions formed on both end portions of the winding wire are connected to each other, respectively.

These wire wound-type inductors including the winding core part having the substantially taper-shaped portion can be used in a wide frequency range. As a reason for this, for example, Japanese Unexamined Patent Application Publication No. 4-137507 discloses that these inductors can reduce resonance points.

SUMMARY

Japanese Unexamined Patent Application Publication No. 4-137507 describes that the wire wound-type inductor disclosed therein has high impedance even at frequencies as high as about to 10 GHz (see, paragraph [0008]) and exerts preferable characteristics. The wire wound-type inductor as disclosed in Japanese Unexamined Patent Application Publication No. 4-137507 however includes a base portion projecting in a substantially flange form on the above-mentioned circular cone-shaped main shaft and realizes a mounted state on a mounting substrate by fixing the base portion onto the mounting substrate with screws in a state in which a plurality of spacers are interposed between the base portion and the mounting substrate. That is to say, the wire wound-type inductor as disclosed in Japanese Unexamined Patent Application Publication No. 4-137507 is relatively large in size and is not a self-standing type or a chip type. Therefore, with the wire wound-type inductor as disclosed in Japanese Unexamined Patent Application Publication No. 4-137507, high-density mounting thereof on the mounting substrate cannot be expected.

Furthermore, Japanese Unexamined Patent Application Publication No. 4-137507 discloses the characteristics at the frequencies in the range of about 6 to 10 GHz as described above but does not disclose characteristics at frequencies higher than this range.

On the other hand, the wire wound-type inductor as disclosed in Japanese Unexamined Patent Application Publication No. 2004-6696 is a chip type and is self-standing. The core included in the wire wound-type inductor is made of dielectric ceramics or a magnetic material such as ferrite (see, a paragraph 0019 in Japanese Unexamined Patent Application Publication No. 2004-6696) and therefore has strength enough to achieve self-standing. Although specific materials of dielectric ceramics as the material forming the core are not described, when the core is made of ferrite, the following is known. That is, in such a case, the wire wound-type inductor exerts preferable electric characteristics only at the frequencies of equal to or lower than about 10 GHz. In a frequency range exceeding about 10 GHz, the impedance thereof is lowered, many resonance points appear, and the wire wound-type inductor with preferable characteristics cannot be used.

Accordingly, it is an object of the present disclosure to provide a wire wound-type inductor including a winding core part having a substantially taper-shaped portion, which is a self-standing chip type and exerts preferable electric characteristics even in a frequency range of higher than about 10 GHz.

One embodiment of the present disclosure is a wire wound-type inductor which is a chip type, the wire wound-type inductor comprises a core including a winding core part having a substantially taper-shaped portion the diameter of which is decreased from one end portion toward the other end portion and first and second flange portions provided on one end portion and the other end portion of the winding core part, respectively, a winding wire that is coated with an electrically insulating coating film and is helically wound around an outer circumferential surface of the winding core part, first and second terminal electrodes that are provided on peripheral surfaces of the first and second flange portions, respectively, at a same side and to which one end and the other end of the winding wire are connected, respectively, and a resistive conductor containing conductive powder. The wire wound-type inductor is mounted on a mounting substrate in a state in which the first and second terminal electrodes are made to face the mounting substrate side. The core of the wire wound-type inductor is made of ceramics. The resistive conductor of the wire wound-type inductor is arranged so as to cover at least a part of surrounding of an outer side portion of the winding wire.

In the wire wound-type inductor having the above-mentioned characteristic configuration, the core made of ceramics can provide strength enough to achieve self-standing. In addition, the resistive conductor contributes to improvement in electric characteristics in a wide frequency range, in particular, electric characteristics at high frequencies as will be described in detail later.

It is preferable that the resistive conductor further contain resin in which the conductive powder is dispersed. With this configuration, the resistive conductor can be easily arranged with a desired thickness at a desired place only by executing a simple process of application of the resin, for example. Furthermore, a capacitance component which is generated between the resistive conductor and the winding wire and loss which is generated in the resistive conductor can be adjusted by changing a ratio between a content of the conductive powder and a content of the resin in the resistive conductor, thereby adjusting a lowering amount of Q of the wire wound-type inductor at high frequencies, which will be described later.

It is preferable that the resistive conductor be arranged so as to cover at least a side opposite to the mounting substrate of the surrounding of the outer side portion of the winding wire. When the resistive conductor is arranged in this manner, a flat surface with the resistive conductor can be easily formed on the side opposite to the mounting substrate of the surrounding of the outer side portion of the winding wire. The flat surface can provide an effect of enhancing certainty and reliability of pick-up of the wire wound-type inductor by vacuum suction in a mounting process on the mounting substrate.

In the above-mentioned preferable embodiment, it is more preferable that the resistive conductor be arranged so as to cover only the side opposite to the mounting substrate surrounding the outer side portion of the winding wire. With this configuration, the resistive conductor can be arranged only at the farthest position from the terminal electrodes. Accordingly, the resistive conductor that is considered to be capable of functioning as a loss material generally can be prevented from adversely influencing a signal path through which a high-frequency signal passes. As a result, deterioration in high-frequency characteristics can be prevented.

For example, the core is made of ferrite or alumina. When the core is made of ferrite, characteristics at low frequencies can be made more preferable than those when the core is made of alumina. On the other hand, when the core is made of alumina, mechanical strength of the core can be made higher than that when the core is made of ferrite.

It is preferable that the conductive powder be made of a magnetic material. When the conductive powder is the magnetic material as described above, inductance values of the wire wound-type inductor at low frequencies can be made higher and loss capable of contributing to improvement in the characteristics at high frequencies can be larger than those when the conductive powder is a non-magnetic material.

According to the embodiments of the present disclosure, the resistive conductor arranged so as to cover at least a part of the surrounding of the outer side portion of the winding wire acts as a resistor that is connected to an inductance component with the winding wire in parallel. As a result, Q of the wire wound-type inductor at high frequencies can be lowered as will be described in detail later. In a general technical field trying to improve Q, lowering of Q is disadvantageous but the embodiments of the present disclosure positively utilize the lowering of Q conversely. That is to say, in the embodiments of the present disclosure, the above-mentioned lowering of Q of the wire wound-type inductor at the high frequencies enables Q of the wire wound-type inductor to be lowered even when series resonance occurs. Therefore, the impedance lowering amount due to the series resonance can be reduced. Accordingly, the embodiments of the present disclosure can provide the wire wound-type inductor having relatively flat electric characteristics in up to a higher frequency range.

Other features, elements, characteristics and advantages of the present disclosure will become more apparent from the following detailed description of some embodiments of the present disclosure with reference to the attached drawings.

BRIEF DESCRIPTION OF THE DRAWINGS

FIG. 4A is an equivalent circuit diagram illustrating the case in which a resistor is connected to an inductance in series and FIG. 4B is a diagram illustrating frequency characteristics of Q in the case of FIG. 4A.

FIG. 5A is an equivalent circuit diagram illustrating the case in which the resistor is connected to the inductance in parallel and FIG. 5B is a diagram illustrating frequency characteristics of Q in the case of FIG. 5A.

FIG. 6A is an LC series resonance circuit diagram and FIG. 6B is a diagram representing how an impedance changes at the resonance point by Q of the resonance circuit when C is an ideal capacitor in the LC series resonance circuit.

DETAILED DESCRIPTION

A wire wound-type inductor 1 according to an embodiment of the present disclosure will be described with reference to FIG. 1 to FIG. 3. The wire wound-type inductor 1 is a self-standing chip type.

Figure 2A:
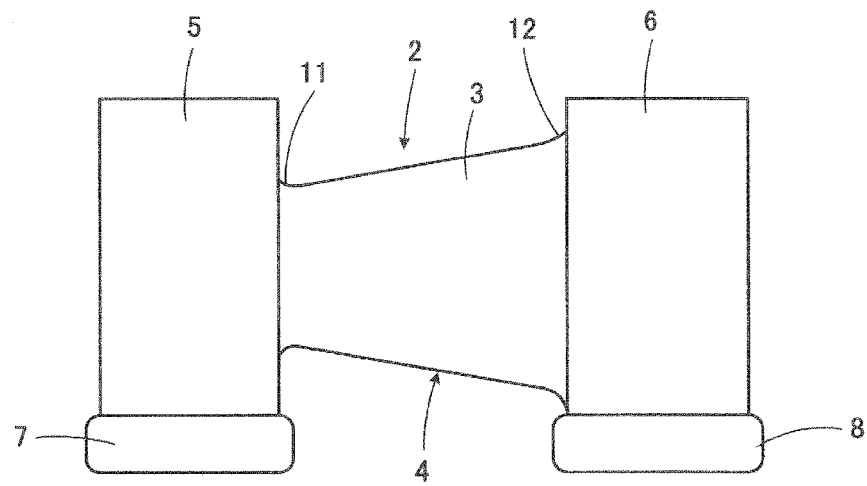
FIG. 2A is a front view illustrating a core included in the wire wound-type inductor as illustrated in FIG. 1.
Figure 2B:
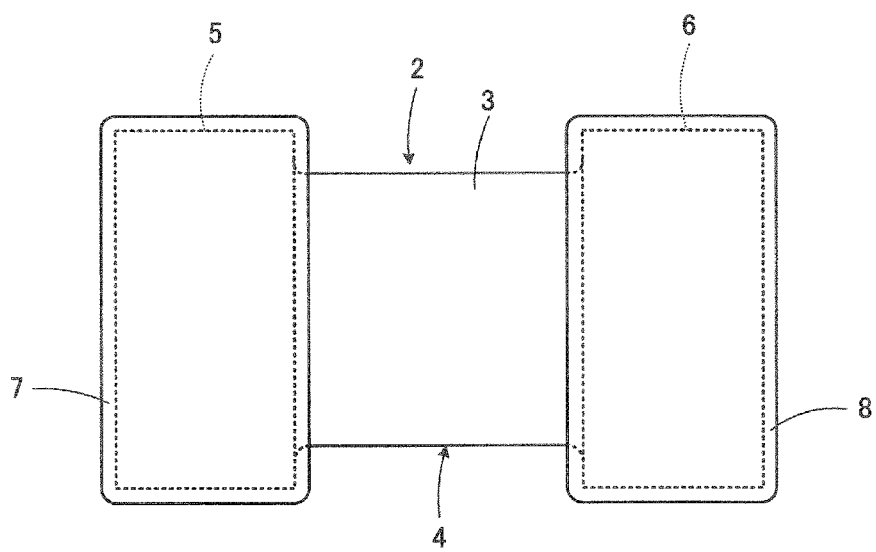
FIG. 2B is a bottom view illustrating a core included in the wire wound-type inductor as illustrated in FIG. 1.

First, the wire wound-type inductor 1 includes a core 2. As illustrated in FIG. 2A obviously, the core 2 includes a winding core part 4 having a substantially taper-shaped portion 3 the diameter of which is decreased from one end portion toward the other end portion. In the embodiment, overall, the core 2 having the substantially taper-shaped portion 3 is formed into a substantially square cross-sectional shape. The contour of the substantially taper-shaped portion 3 when seen in the front view as illustrated in FIG. 2A has tapered surfaces and the contour thereof when seen in the bottom view as illustrated in FIG. 2B has parallel surfaces.

The shape of the substantially taper-shaped portion 3 may be another substantially a frustum of pyramid shape or a shape other than substantially a frustum of pyramid shapes, for example, a substantially a frustum of cone shape. In the embodiment, overall the winding core part 4 is virtually configured by the substantially taper-shaped portion 3. Alternatively, only a part of the winding core part may be configured by the substantially taper-shaped portion whereas a remaining part of the winding core part may be configured by a shaped portion having a uniform diameter, such as a substantially prism-shaped portion or a substantially column-shaped portion.

The core 2 has first and second flange portions 5 and 6 provided on each end portion of the winding core part 4. The flange portions 5 and 6 are formed into substantially square cross-sectional shapes, for example.

First and second terminal electrodes 7 and 8 are provided on the first and second flange portions 5 and 6, respectively. In order to configure the wire wound-type inductor 1 as an electronic component capable of being surface-mounted, these first and second terminal electrodes 7 and 8 are provided on the peripheral surfaces of the first and second flange portions 5 and 6, which face the same side, that is, the lower surfaces of the first and second flange portions 5 and 6 formed into the substantially square cross-sectional shapes, respectively. The first and second terminal electrodes 7 and 8 are formed by baking of applied conductive pastes, plating of conductive metal, or the like.

Figure 1:
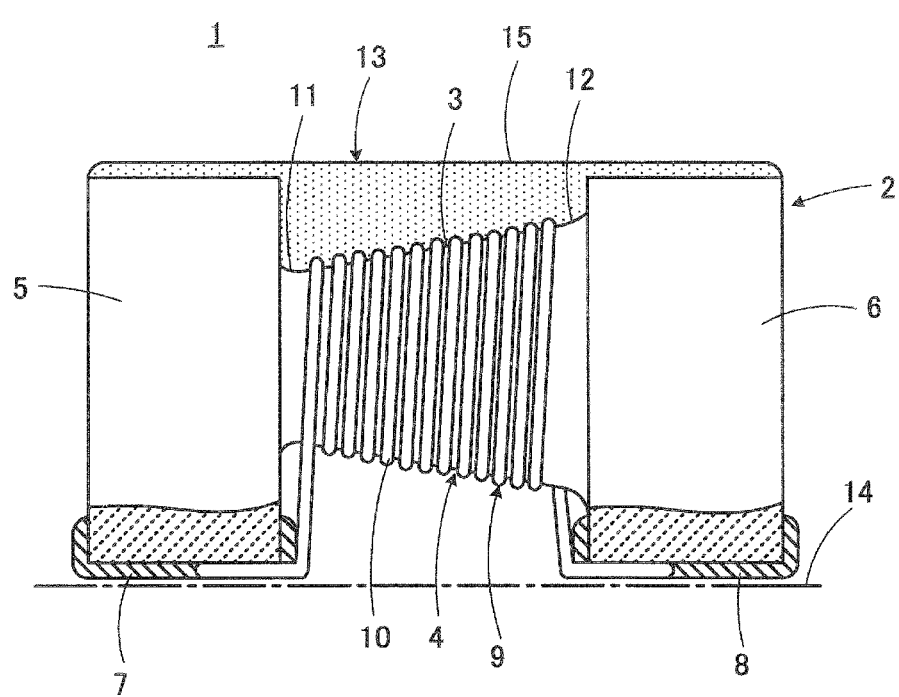
FIG. 1 is a front view illustrating a wire wound-type inductor according to one embodiment of the present disclosure.
Figure 3:
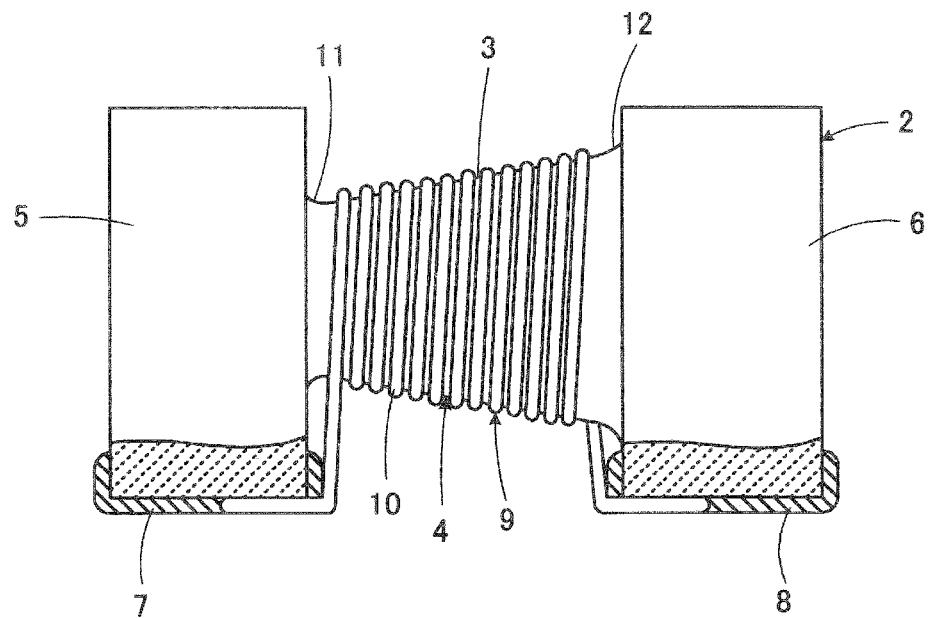
FIG. 3 is a front view illustrating a state in which a winding wire is wound around a winding core part of the core illustrated in FIGS. 2A and 2B.

As illustrated in FIG. 1 and FIG. 3, the wire wound-type inductor 1 includes a winding wire 9 that is helically wound around the outer circumferential surface of the winding core part 4. The winding wire 9 is coated with an electrically insulating coating film 10. One end and the other end of the winding wire 9 are connected to the first and second terminal electrodes 7 and 8, respectively. For example, thermal pressure bonding is applied to the connection between the winding wire 9 and the terminal electrodes 7 and 8.

In FIG. 1 and FIG. 3, connection portions between the winding wire 9 and the terminal electrodes 7 and 8 are illustrated by cross sections.

In the above-mentioned wire wound-type inductor 1, the core 2 is made of ceramics like a magnetic material such as ferrite or a dielectric material such as alumina. The core 2 made of ceramics can provide strength enough to achieve self-standing. Portions 11 and 12 of the end portions of the winding core part 4, which are connected to the first and second flange portions 5 and 6, respectively, are subjected to round chamfering as illustrated in the drawings. This can also contribute to improvement in the strength of the core 2.

As illustrated in FIG. 1, the wire wound-type inductor further includes a resistive conductor 13 containing conductive powder, which is arranged so as to cover at least a part of the surrounding of an outer side portion of the winding wire 9 with the coating film 10 interposed therebetween. The resistive conductor 13 may be arranged so as to cover overall surrounding the winding wire 9. The resistive conductor 13 is preferably arranged so as to cover at least the side opposite to a mounting substrate 14 the surrounding of the outer side portion of the winding wire 9. In FIG. 1, only the surface of the mounting substrate 14 is indicated by an alternate long and short dash line. In the case in which the resistive conductor 13 is arranged in this manner, when a flat surface 15 is formed on the upper surface of the resistive conductor 13, the flat surface 15 can be advantageously used as a surface to which a vacuum suction chuck for pick-up of the wire wound-type inductor by vacuum suction is applied in a mounting process on the mounting substrate 14. Accordingly, the flat surface 15 can provide an effect of enhancing certainty and reliability of the mounting process.

More preferably, the resistive conductor 13 is arranged so as to cover only the side opposite to the mounting substrate 14 of the surrounding of the outer side portion of the winding wire 9, as illustrated in FIG. 1. In other words, the resistive conductor 13 is arranged only at a position farthest from the terminal electrodes 7 and 8. With this configuration, the resistive conductor 13 can be made difficult to adversely influence a signal path through which a high-frequency signal passes. As a result, ease of deterioration in high-frequency characteristics can be suppressed. It should be noted that the surrounding of the outer side portion of the winding wire 9 herein indicates the surrounding of the outer side portion of overall the helical shape of the winding wire 9 wound around the winding core part 4 and does not indicate the surrounding of the outer side portion in the transverse cross section of the winding wire 9, for example. To be specific, the surrounding of the outer side portion of the winding wire 9 does not encompass a region between the winding wire 9 and the winding core part 4, and the like.

It is preferable that the resistive conductor 13 further contain resin in which the conductive powder is dispersed. With this configuration, the resistive conductor 13 can be easily arranged with a desired thickness at a desired place only by executing a simple process of application of the resin, for example. Furthermore, a capacitance component which is generated between the resistive conductor 13 and the winding wire 9 and loss which is generated in the resistive conductor 13 can be adjusted by changing a ratio between a content of the conductive powder and a content of the resin in the resistive conductor 13, thereby adjusting the lowering amount of Q of the wire wound-type inductor at high frequency, which will be described later. As the resin, for example, resin hardened with ultraviolet rays can be advantageously used.

It should be noted that for example, the resistive conductor 13 may be also formed by applying resin functioning as an adhesive to a desired place on the surrounding of the outer side portion of the winding wire 9 and dusting the resin with the conductive powder, instead of usage of the above-mentioned resin in which the conductive powder is dispersed.

The conductive powder can be made of conductive metal such as iron, copper, and nickel, for example. In particular, the conductive powder is preferably made of a magnetic material such as iron and nickel. When the conductive powder is the magnetic material as described above, inductance values of the wire wound-type inductor 1 at low frequencies can be made higher and loss capable of contributing to improvement in characteristics at high frequencies can be made larger than those when the conductive powder is a non-magnetic material.

Hereinafter, approaches made by the present inventors for completing the present disclosure will be described.

Japanese Unexamined Patent Application Publication No. 4-137507 as mentioned above discloses the following. That is, the resonance points can be reduced by winding the winding wire around the circumference of the substantially cone-shaped winding core part such that the diameter thereof is gradually decreased. The expression however has a few errors. That is, the resonance points themselves cannot be reduced even by winding the winding wire around the circumference of the substantially cone-shaped winding core part but the resonance points are made unnoticeable. The expression is rightly understood as follows.

When the winding core part is formed into the substantially taper shape like a cone shape, inductances of respective turns of the winding wire helically wound around the circumference thereof and stray capacitances between the respective turns and adjacent turns thereto vary little by little. Therefore, the resonant frequencies of the respective turns shift little by little. In particular, when the diameter of the winding core part is decreased, the resonant frequency shifts to the high-frequency side and the shift amount thereof correlates with the diameter of the winding core part. Therefore, when the diameter of the winding core part is gradually decreased as in the configuration disclosed in Japanese Unexamined Patent Application Publication No. 4-137507 and Japanese Unexamined Patent Application Publication No. 2004-6696, the resonant frequencies of the respective turns of the winding wire wound around the winding core part shift to the high-frequency side and slightly shift from each other. Accordingly, with this configuration, the adjacent resonance frequencies are extremely close to each other and a large number of the resonance are generated.

The "resonant frequency" herein indicates the resonant frequency where parallel resonance occurs. Because the impedance is increased at the parallel resonance frequency, the parallel resonance does not lower performance of the inductor. The problem is inevitable occurrence of series resonance at the frequencies between the parallel resonance frequencies (this is established by the theory of "reactance two-terminal network" in the electric circuit theory). The impedance is decreased at the series resonance frequency, so the series resonance lowers the performance of the inductor unlike the parallel resonance. In contrast, with the configuration disclosed in Japanese Unexamined Patent Application Publication No. 4-137507 or Japanese Unexamined Patent Application Publication No. 2004-6696 as described above, the adjacent parallel resonance frequencies are extremely close to each other and a large number of the parallel resonances are generated. In such a case, the frequencies where the series resonance occurs and the frequencies where the parallel resonance occurs are extremely close to each other. Therefore, the increase and decrease in the impedance are cancelled by each other. The occurrence of series resonance is actually masked by the close parallel resonance and the resonance become unnoticeable. Thus, when the winding wire is wound around the circumference of the substantially taper-shaped winding core part, high impedance seems to be obtained in a wide range.

On the other hand, when the impedance is tried to be ensured at higher frequencies by this method, the diameter of the winding core part is required to be further decreased. In particular, with the configuration disclosed in Japanese Unexamined Patent Application Publication No. 2004-6696, when the diameter of the winding wire part corresponding to the winding core part is decreased, the strength of the core, specifically, the strength in bonding portions between the flange portions and the winding wire part cannot be kept. That is to say, the above-mentioned method has a problem in ensuring of both of the core strength enough to achieve the self-standing core reduced in size and the impedance at higher frequencies.

There is another method for making the above-mentioned resonance unnoticeable. That is, the lowering amount of the impedance due to the series resonance is reduced by lowering Q of a resonance circuit (equivalent circuit of the wire wound-type inductor). In particular, the present inventors have focused on capability of broadening the operating frequency band if Q of the resonance circuit of the series resonance can be lowered at high frequency.

There are two ways in order to lower Q of the resonance circuit. The one is increasing loss by the capacitance component and the other one is increasing loss by the inductance component. There are however few methods of increasing loss by the capacitance component at high-frequency. Accordingly, increasing the loss by the inductance component is more realistic.

When the loss of the inductance component is tried to be increased, increasing loss of the winding wire itself is easily contrived but it is not expedient for the following reason. That is, when a winding wire having low conductivity is used, a direct-current resistance component is increased. Above all, as for frequency characteristics of Q of the winding wire, as the frequency is higher, Q is increased.

Figure 4A:
FIG. 4A and FIG. 4B are diagrams for explaining processes to completion of the present disclosure.
Figure 4B:
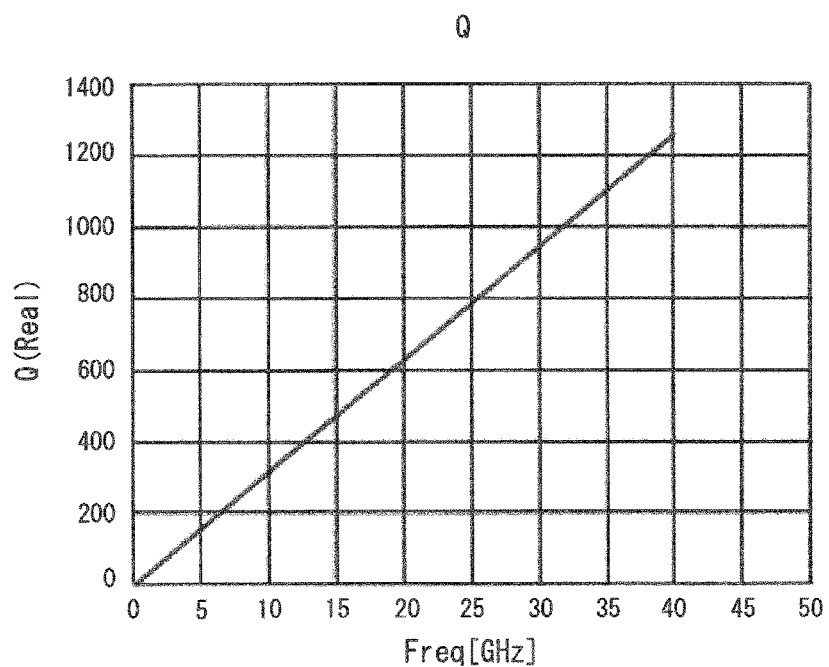

This is easy to be understood by examining Q of a circuit while the wire wound-type inductor is considered as the circuit in which a resistor R is connected to an inductance L in series as illustrated in FIG. 4A modeled by involving the resistance component of the winding wire itself. Q of the circuit is expressed by jωL/R (j is an imaginary unit, ω is a frequency, L is an inductance value of L, R is an resistance value of R), and when the frequency is increased, Q of the circuit is increased basically. R in the denominator has frequency characteristics and is increased proportional to the square root of the frequency because an effect called skin effect acts. On the other hand, jωL in the numerator is proportional to the frequency. Therefore, as illustrated in FIG. 4B representing the frequency characteristics of Q of the circuit in FIG. 4A, Q of the circuit becomes extremely high at high frequencies. It should be noted that FIG. 4B illustrates the case in which L is fixed to about 5 nH and R is fixed to about 1Ω. Accordingly, it is difficult to lower Q at high frequencies by increasing loss of the winding wire itself.

Figure 5A:
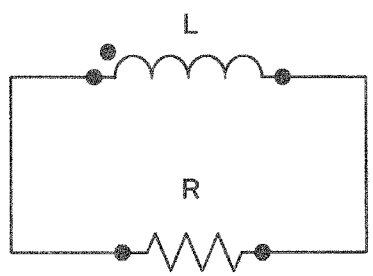
FIG. 5A and FIG. 5B are diagrams for explaining processes to the completion of the present disclosure.
Figure 5B:
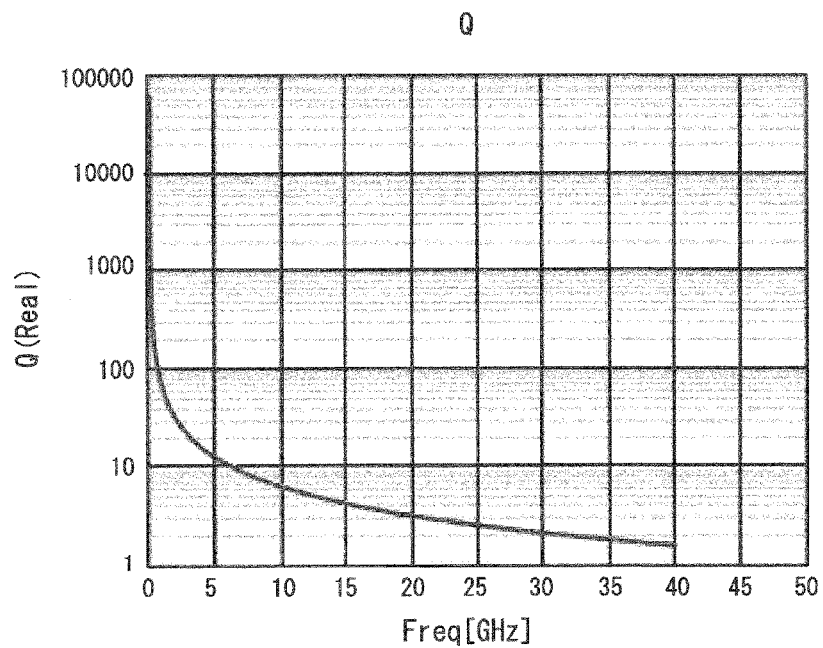

The present inventors have focused on increasing loss of the inductance component by applying the resin in which the conductive powder such as the magnetic powder is dispersed to the surrounding of the winding wire, for example. Insulation coating is applied to the winding wire normally and a conductor portion of the winding wire does not make contact with the conductive powder contained in the resin. With the above-mentioned configuration, as illustrated in FIG. 5A, the wire wound-type inductor can be considered as a circuit in which the resistor R is connected to the inductance L in parallel. Q of this circuit is expressed by R/jωL. Therefore, as illustrated in FIG. 5B, Q of the circuit is high in a low frequency range and low in a high frequency range inversely with FIG. 4B. It should be noted that FIG. 5B illustrates the case in which L is fixed to about 5 nH and R is fixed to about 2 kΩ.

Figure 6A:
FIG. 6A and FIG. 6B are diagrams for explaining processes to the completion of the present disclosure.
Figure 6B:
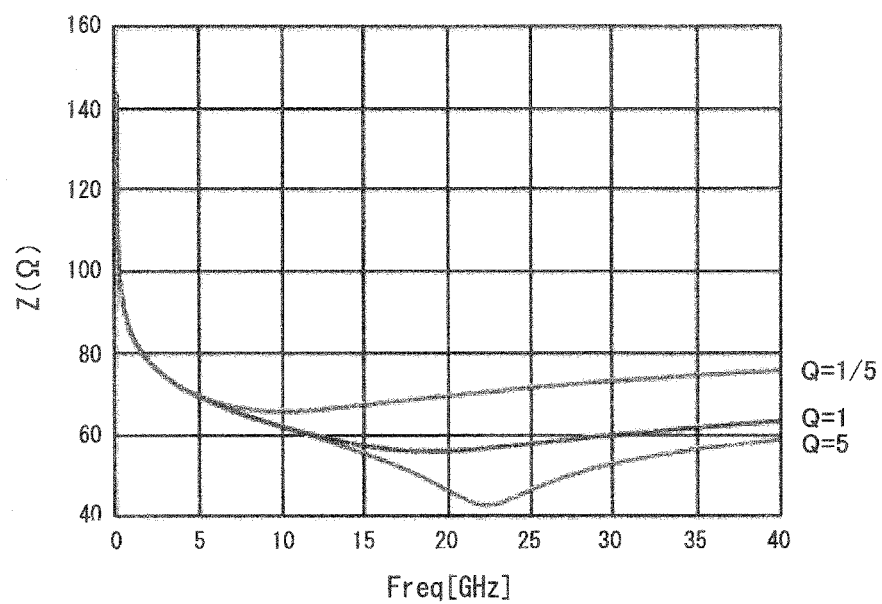

Meanwhile, a wide-band choke that is required to keep high impedance at the frequency where LC series resonance occurs needs to have an extremely small value of Q when the series resonance occurs in order to further reduce the lowering amount of the impedance when the series resonance occurs. FIG. 6A is a diagram illustrating the LC series resonance circuit and FIG. 6B is a diagram representing how an impedance changes at the resonance point by Q of the resonance circuit when C is an ideal capacitor in the LC series resonance circuit. It should be noted that FIG. 6B illustrates the case in which L is fixed to about 5 nH and C is fixed to about 0.01 pF.

As illustrated in FIG. 6B, the resonance can be suppressed when an inductor having an extremely low value of Q as low as equal to or less than about 1 can be realized. The impedance is however required to be equal to or higher than several hundreds Ω as a target value, normally. Therefore, the impedance does not actually reach the target value only by the method of lowering of Q. With reference to FIG. 6B, it is found that the impedance does not reach several hundreds Ω even if Q is an extremely low value as low as about ⅕, for example. In consideration of this, the present inventors have arrived at achievement of the target value by combining a method for preventing lowering of the impedance at the series resonance point by winding the winding wire around the circumference of the substantially taper-shaped winding core part with the above-mentioned method by lowering of Q.

The above-mentioned combination eliminates the necessity to lower Q to be as low as about 1 as illustrated in FIG. 6B actually. In any case, it is obvious that the parallel resistance is appropriate for suppression of resonance. In particular, the present inventors have found that usage of the resistive conductor containing the conductive powder as the parallel resistance is preferable. The loss in the parallel resistance is, for example, eddy current loss. When metal alone (metal plate or the like) is used as the parallel resistance, the eddy current loss is excessively increased and desired characteristics as the inductor cannot be obtained in some cases. On the other hand, when the conductive powder is used, the magnitude of the eddy current loss can be adjusted with the particle diameter of the powder and both of the necessary and sufficient lowering of Q at high frequencies with the loss and the characteristics of the inductor can be achieved. When the resistive conductor contains the resin in which the conductive powder is dispersed, the capacitance component which is generated between the resistive conductor and the winding wire and the loss which is generated in the resistive conductor can be also adjusted by changing the ratio between the content of the conductive powder and the content of the resin in the resistive conductor, it is therefore more preferable.

When the loss is connected to the inductance L in parallel actually, a method in which the core itself is made conductive can be also considered. However, when overall the core is made of the conductive material alone, the loss is excessively increased and the desired characteristics cannot be obtained in the same manner as described above. Furthermore, even when the conductive powder is used as the material of the core, normally, the material is brittle and does not have strength enough to support itself in many cases. In consideration of them, the present inventors have arrived at application of the conductive powder to the outer side portion of the winding wire while using, for the core, durable ceramics like the magnetic material such as ferrite or the dielectric material such as alumina as in the disclosure in order to obtain the shape of the self-standing chip-type inductor. Employment of this configuration enables both of the strength and the characteristics to be achieved in the wire wound-type inductor including the winding core part having the substantially taper-shaped portion.

Moreover, the present inventors have examined that the frequency characteristics of Q based on materials are checked in order to select the material functioning as the loss for connecting the loss to the inductance L in parallel actually. However, at the time point of the present application, a method for directly measuring the Q characteristics of a material at a high frequency, for example, several tens GHz has not been found. For coping with this, the present inventors have arrived at pseudo measurement of the Q characteristics of the material by considering a linear wire connected to a measurement device as the inductor and measuring Q of the wire (inductor) in a state in which the material functioning as the loss is arranged in the vicinity of the wire, to be specific, under the wire.

Figure 7:
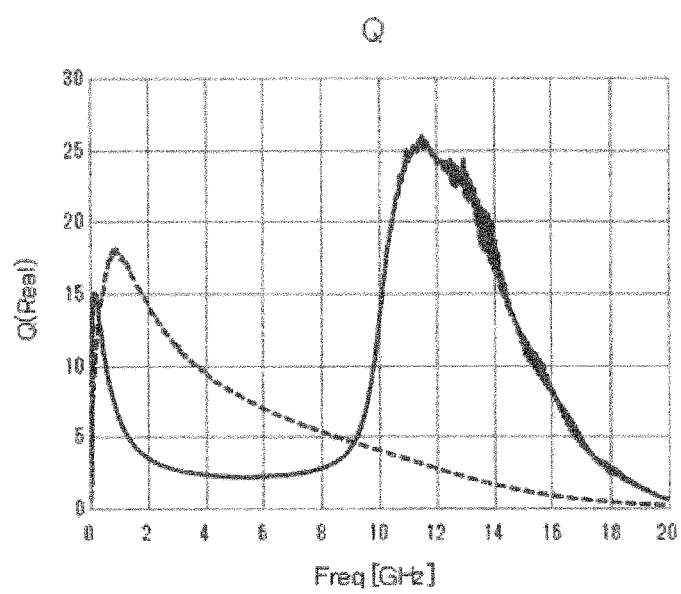
FIG. 7 is a diagram for explaining processes to the completion of the present disclosure and illustrating the frequency characteristics (solid line) of Q of an inductor using a ferrite material and frequency characteristics (dashed line) of Q of an inductor using magnetic powder containing iron in a comparison manner.

FIG. 7 illustrates frequency characteristics of Q of the inductor when a NiZn-based ferrite material is arranged by a solid line and illustrates frequency characteristics of Q of the inductor when the magnetic powder containing iron is arranged by a dashed line. By comparing these frequency characteristics of Q with each other, it is found that when the magnetic powder containing iron is arranged as indicated by the dashed line, Q is high at particularly low frequencies whereas Q is extremely low at frequencies as high as equal to or more than about 10 GHz, for example. By contrast, it is found that when the NiZn-based ferrite material is arranged as indicated by the solid line, Q is low at low frequencies inversely and it is effective for suppression of the resonance at the low frequencies whereas Q is drastically increased at the vicinity of about 10 GHz as a boundary, and it is not appropriate for suppression of the resonance in a frequency band of equal to or higher than about 10 GHz. When a hexagonal ferrite material or the like is used as the ferrite material other than the NiZn-based ferrite material, for example, the frequency at which Q is drastically increased can be made higher possibly. In any case, it is effective to use the ferrite material for suppression of the resonance at low frequencies.

The above-mentioned ferrite corresponds to ceramics forming the core in the present disclosure and the above-mentioned magnetic powder containing iron corresponds to the conductive powder contained in the resistive conductor in the present disclosure. That is to say, in the present disclosure, by combining ceramics and the conductive powder with each other, resonance can be suppressed in a wide range from low frequencies to high frequencies, high impedance can be kept, and disadvantages in the strength can be solved.

Figure 8A:
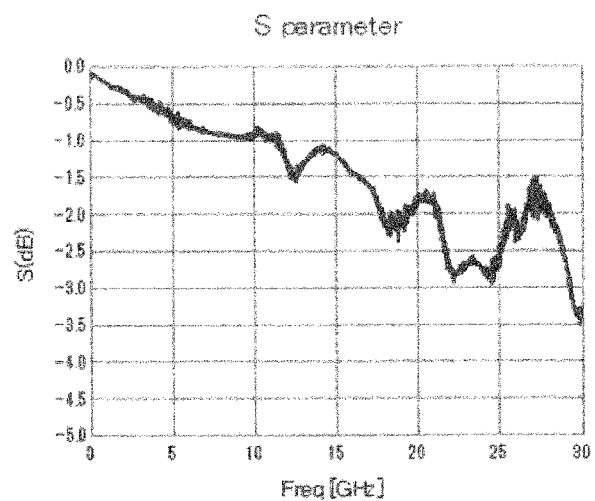
FIG. 8A is a diagram illustrating frequency characteristics of a scattering(S) parameter of the wire wound-type inductor as an example of the present disclosure.
Figure 8B:
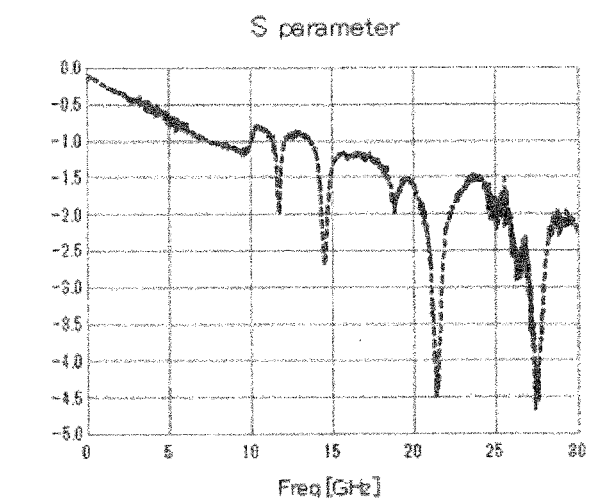
FIG. 8B is a diagram illustrating frequency characteristics of the S parameter of a wire wound-type inductor including no resistive conductor as comparative example.
Figure 8C:
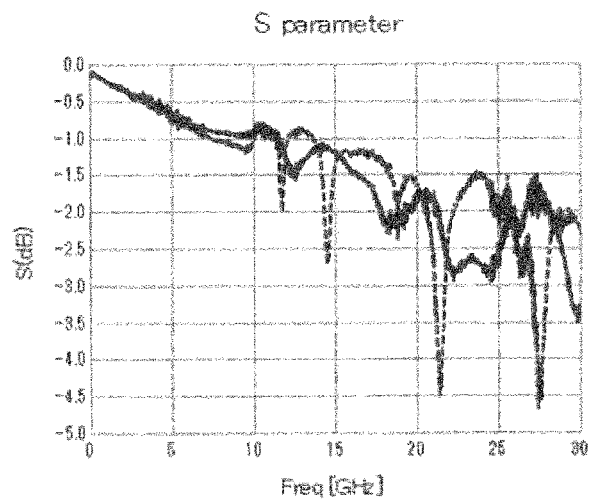
FIG. 8C is a diagram illustrating the frequency characteristics illustrated in FIG. 8A and FIG. 8B in an overlapped manner in order to easily compare the frequency characteristics of the S parameters in an example and a comparative example.

FIG. 8A to FIG. 8C illustrate frequency characteristics of respective S parameters of the wire wound-type inductor as an example of the present disclosure and a wire wound-type inductor including no resistive conductor as a comparative example. To be more specific, FIG. 8A illustrates the frequency characteristics of the S parameter of the wire wound-type inductor as an example, FIG. 8B illustrates the frequency characteristics of the S parameter of the wire wound-type inductor as a comparative example, and FIG. 8C illustrates the frequency characteristics illustrated in FIG. 8A and FIG. 8B in an overlapped manner in order to easily compare the frequency characteristics of the S parameters in an example and a comparative example. It should be noted that the wire wound-type inductor as comparative example has the configuration as illustrated in FIG. 3, for example.

As illustrated in FIG. 8B, in a comparative example for the wire wound-type inductor including no resistive conductor, there are several places at which the S parameter highly lowers in a frequency range of higher than about 10 GHz. That is to say, gradual decrease in the diameter of the winding core part is insufficient, so that the number of parallel resonance points is insufficient and the parallel resonance cannot mask the series resonance sufficiently in the frequency range of higher than about 10 GHz. By contrast, in an example for the wire wound-type inductor including the resistive conductor, as illustrated in FIG. 8A, there is no place at which the S parameter highly lowers also in the frequency range of higher than about 10 GHz. In view of the above-mentioned results, with the wire wound-type inductor including the resistive conductor according to the present disclosure, the effect of making the series resonance unnoticeable by the gradual decrease in the diameter of the winding core part 4 (a large number of parallel resonance points that are extremely close to each other) and the effect of reducing the impedance lowering amount due to the series resonance by lowering Q of the resonance circuit (wire wound-type inductor 1) at high frequencies at which the series resonance occurs are combined. This can prevent the lowering of the impedance due to the series resonance. As a result, preferably, that is, flat electric characteristics to a high frequency range of higher than about 10 GHz can be achieved.

While an embodiment of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A wire wound-type inductor which is a chip type, the wire wound-type inductor comprising:
   a core including a winding core part having a taper-shaped portion the diameter of which is decreased from one end portion toward the other end portion and first and second flange portions provided on one end portion and the other end portion of the winding core part, respectively;
   a winding wire coated with an electrically insulating coating film and helically wound around an outer circumferential surface of the winding core part;
   first and second terminal electrodes provided on peripheral surfaces of the first and second flange portions, respectively, at a same side and to which one end and the other end of the winding wire are connected, respectively; and
   a resistive conductor containing conductive powder,
   wherein the wire wound-type inductor is mounted on a mounting substrate in a state in which the first and second terminal electrodes are made to face the mounting substrate side,
   the core is made of ceramics, and
   the resistive conductor is arranged so as to cover at least a part surrounding an outer side portion of the winding wire.

2. The wire wound-type inductor according to claim 1, wherein the resistive conductor further contains resin in which the conductive powder is dispersed.

3. The wire wound-type inductor according to claim 1, wherein the resistive conductor is arranged so as to cover at least a side opposite to the mounting substrate of the surrounding of the outer side portion of the winding wire.

4. The wire wound-type inductor according to claim 3, wherein the resistive conductor is arranged so as to cover only the side opposite to the mounting substrate surrounding the outer side portion of the winding wire.

5. The wire wound-type inductor according to claim 1, wherein the core is made of ferrite.

6. The wire wound-type inductor according to claim 1, wherein the core is made of alumina.

7. The wire wound-type inductor according to claim 1, wherein the conductive powder is made of a magnetic material.

* * * * *